(12) United States Patent
Eneman et al.

(10) Patent No.: US 11,387,350 B2
(45) Date of Patent: Jul. 12, 2022

(54) SEMICONDUCTOR FIN STRUCTURE AND METHOD OF FABRICATING THE SAME

(71) Applicant: IMEC vzw, Leuven (BE)

(72) Inventors: Geert Eneman, Heverlee (BE);
Bartlomiej Pawlak, Heverlee (BE);
Liesbeth Witters, Lubbeek (BE);
Geoffrey Pourtois, Villers-la-Ville (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/719,852

(22) Filed: Dec. 18, 2019

(65) Prior Publication Data
US 2020/0212205 A1    Jul. 2, 2020

(30) Foreign Application Priority Data
Dec. 27, 2018    (EP) .................................... 18248027

(51) Int. Cl.
| | |
|---|---|
| *H01L 29/66* | (2006.01) |
| *H01L 21/8234* | (2006.01) |
| *H01L 21/84* | (2006.01) |
| *H01L 29/161* | (2006.01) |
| *H01L 29/78* | (2006.01) |

(52) U.S. Cl.
CPC ............ *H01L 29/66818* (2013.01); *H01L 21/823431* (2013.01); *H01L 21/845* (2013.01); *H01L 29/161* (2013.01); *H01L 29/785* (2013.01)

(58) Field of Classification Search
CPC ........... H01L 29/66818; H01L 29/161; H01L 29/785; H01L 21/823431; H01L 21/845
See application file for complete search history.

(56) References Cited

U.S. PATENT DOCUMENTS

| | | | |
|---|---|---|---|
| 8,617,996 B1 | 12/2013 | Chi et al. | |
| 8,658,536 B1 | 2/2014 | Choi et al. | |
| 9,318,342 B2 | 4/2016 | Xie et al. | |
| 9,406,680 B1* | 8/2016 | Chang | ................ H01L 29/165 |
| 9,704,973 B2 | 7/2017 | Xie et al. | |
| 2005/0202604 A1 | 9/2005 | Cheng et al. | |
| 2014/0027816 A1 | 1/2014 | Cea et al. | |
| 2016/0351590 A1* | 12/2016 | Cheng | .............. H01L 29/66795 |
| 2017/0236722 A1 | 8/2017 | Fan et al. | |

(Continued)

OTHER PUBLICATIONS

Extended European Search Report dated Oct. 17, 2019 for European Patent Application No. 18248027.7 in 11 pages.

*Primary Examiner* — Shaun M Campbell
(74) *Attorney, Agent, or Firm* — Knobbe, Martens, Olson & Bear, LLP

(57) ABSTRACT

According to one aspect, a method of fabricating a semiconductor structure includes cutting a semiconductor fin extending along a substrate. Cutting the semiconductor fin can comprise forming a fin cut mask. The fin cut mask can define a number of masked regions and a number of cut regions. The method can include cutting the fin into a number of fin parts by etching the fin in the cut regions. The method can further comprise forming an epitaxial semiconductor capping layer on the fin prior to forming the fin cut mask or on the fin parts subsequent to cutting the fin. A capping layer material and a fin material can be lattice mismatched. According to another aspect, a corresponding semiconductor structure comprises fin parts.

15 Claims, 7 Drawing Sheets

(56) References Cited

U.S. PATENT DOCUMENTS

2018/0090491 A1    3/2018  Huang et al.
2018/0108655 A1*   4/2018  Greene ............... H01L 21/3081
2018/0166570 A1*   6/2018  Kung ................ H01L 29/66795
2019/0157156 A1*   5/2019  Chen ................. H01L 21/0217
2019/0363026 A1*  11/2019  Lee .................. H01L 27/0924

* cited by examiner

100# SEMICONDUCTOR FIN STRUCTURE AND METHOD OF FABRICATING THE SAME

CROSS-REFERENCE TO RELATED APPLICATIONS

This application claims foreign priority to European Patent Application No. EP 18248027.7, filed Dec. 27, 2018, the content of which is incorporated by reference herein in its entirety.

BACKGROUND

Field

The disclosed technology generally relates to semiconductor structures and more particularly to semiconductor fin structures extending along a substrate, and methods of fabricating the same.

Description of the Related Technology

The ongoing trend for miniaturizing the dimensions of circuit elements and improving their functionalities uses continuous scaling of the feature size of the building blocks of the circuit elements. An example of such building blocks is a semiconductor fin, a three-dimensional (3D) body made of a semiconductor material. A common application for semiconductor fins include fin field effect transistors (FinFETs). Semiconductor fin fabrication may typically comprise patterning fins in one or more epitaxial semiconductor layers. The fins may be defined using single- or multiple patterning techniques such as self-aligned double patterning (SADP) or self-aligned quadruple patterning (SAQP). Each fin may extend along a respective "fin track." The fins may subsequently be subjected to a fin cutting process, wherein transverse cuts or gaps are etched through the fins to form a number of fin parts along each fin track. Devices, such as FinFETs, may thereafter be formed along the fin parts.

SUMMARY OF CERTAIN INVENTIVE ASPECTS

In some applications, fins may be formed on a semiconductor substrate made of a material with a different lattice constant than the fins. The fins may hence be pre-strained due to the lattice mismatch between the fin and substrate in order to increase carrier mobility in the channel. Applying a fin cut process to such a pre-strained fin may result in at least partial relaxation of the lattice structure of the fin parts, e.g., in the regions of the cuts. This may in turn degrade the electrical properties of the devices to be formed on the fin parts.

An objective of the disclosed technology is to address this issue. Further and alternative objectives may be understood from the following.

According to an aspect of the disclosed technology, there is provided a method of fabricating a semiconductor structure including cutting a semiconductor fin extending along a substrate. The method can comprise forming a fin cut mask defining a number of masked regions and a number of cut regions. The method can also include cutting the fin into a number of fin parts by etching the fin in the cut regions, and forming an epitaxial semiconductor capping layer on the fin prior to forming the fin cut mask or on the fin parts subsequent to cutting the fin. A capping layer material and a fin material can be lattice mismatched.

According to another aspect of the disclosed technology, a semiconductor structure can comprise a substrate, a number of semiconductor fin parts extending along the substrate, and an epitaxial semiconductor capping layer formed on each fin part. A capping layer material and a fin material can be lattice mismatched.

The disclosed technology can provide an interface between the fin or fin parts and the capping layer which forms a lattice-mismatched heterojunction. The substrate may be a semiconductor substrate providing a pre-strain to the fin. If the epitaxial semiconductor capping layer is formed on the fin prior to cutting the fin, the lattice-mismatch may reduce, counteract or limit relaxation of a pre-strained lattice structure of the fin after cutting the fin into a number of fin parts. If the capping layer is formed on the fin parts, subsequent to cutting the fin into a number of fin parts, the lattice-mismatch may recover a pre-strain in the fin parts. In addition, in both scenarios the epitaxial semiconductor capping layer on the fin or fin parts may also be used to apply additional strain to the lattice structure of the respective fin or fin parts.

Although the disclosed technology advantageously may be applied on a pre-strained fin, it is not limited thereto. Indeed, the capping layer may also be employed to provide strain in a fin, or in fin parts of a cut fin, exhibiting no pre-strain.

The method may comprise subsequent to cutting the fin, forming a fill structure by refilling gaps in the cut regions, between fin parts, with an insulating material in some implementations. For example, the fill structure in the cut regions may maintain a separation between the fin parts. The fill structure may also provide mechanical support for the fin parts during further processing steps.

The fill structure may be subjected to an anneal. In some implementations, the insulating material of the fill structure may solidify.

The method may comprise, prior to forming the fin cut mask, forming an insulating layer embedding a bottom portion of the fin. Forming the capping layer can comprise forming the capping layer on an upper portion of the fin or fin parts protruding above the insulating layer. The insulating layer may mask the substrate during the formation of the capping layer and thus reduce and/or counteract capping layer deposition on the substrate (e.g., in regions between fin parts or between the fin and any further fins present on the substrate). The insulating layer may form a shallow trench insulation (STI) and may provide electrical insulation towards any neighboring fins present on the substrate.

The method may comprise, prior to cutting the fin, forming an insulating layer embedding the fin in the cut regions. In some instances, the insulating layer may be formed on opposite sides of fin in the cut region. The insulating layer may provide mechanical support for the capping layer during etching of the fin in the cut region.

According to some embodiments, the epitaxial semiconductor capping layer may be formed on the fin prior to forming the fin cut mask, e.g., forming a capped fin. The capped fin may comprise cutting the capped fin into a number of capped fin parts by etching the capped fin in the cut regions.

The capping layer may cover sidewall surfaces of the fin. The capping layer may cover a top surface of the fin. The capping layer may form a cladding on the fin.

During the etching of the fin, the fin cut mask may expose capping layer portions on top surface in the cut regions. In some instances, the fin cut mask may mask the capping layer and the fin in the mask regions. Exposed capping layer portions on the top surface may be removed from the fin during the cutting of the fin. The capping layer portions and the fin may be etched in a same etch step or in two or more sequential etch steps (e.g., a first etch step to etch the capping layer portions and a second etch step to etch the fin).

The method may comprise removing the capping layer in the cut regions during the cutting of the (capped) fin or subsequent to the cutting of the (capped) fin. The capping layer in the cut region may be removed to provide electrical separation between the fin parts.

The method may comprise forming a fill structure by refilling gaps in the cut regions, between fin parts, with an insulating material. The capping layer can be removed in the cut regions subsequent to forming the fill structure. The presence of the fill structure may reduce and/or counteract relaxation when the capping layer is removed in the cut regions. In some implementations, the fill structure may further be subjected to an anneal.

The method may comprise, subsequent to forming the capping layer and prior to forming the fin cut mask, forming a sidewall spacer layer on capping layer portions formed along sidewalls of the fin. The sidewall spacer may provide structural support for the fin during the fin cutting. The sidewall spacer which may further facilitate simultaneous cutting/etching of the fin and the capping layer by reducing and/or counteracting relaxation, which otherwise could occur when the capping layer is etched in the cut regions.

Subsequent to forming the sidewall spacer layer, an insulating layer may be formed to embed the fin with the capping layer and sidewall spacer layer formed thereon, and exposing an upper surface of the fin. In some implementations, the insulating layer may be formed on opposite sides of the fin. The insulating layer may be formed along an entire (or substantially entire) length of the fin and to cover the fin. In some instances, the insulating layer may provide a planar surface on which the fin cut mask may be formed. The formation of the insulating layer may provide mechanical support for the sidewall spacer during etching of the fin and/or capping layer in the cut regions.

The method may comprise removing the sidewall spacer layer subsequent to cutting the fin. In some implementations, the sidewall spacer layer may be removed subsequent to removing the fin cut mask.

According to some embodiments, the epitaxial semiconductor capping layer may be formed on the fin parts subsequent to cutting the fin. In some instances, the capping layer may form a cladding on the fin parts e.g., the capping layer may be formed on at least a top surface and sidewall surfaces of each fin part. The capping layer may also be formed on end surfaces of each fin part (e.g., the surfaces of the fin parts facing the cut regions). As may be understood from the above, the cladding may introduce and/or preserve strain within the fin parts.

The semiconductor fin may be formed of a silicon (Si) and/or germanium (Ge) comprising material. The capping layer may be formed of a silicon and/or germanium material of a different composition than the semiconductor fin. The fin may more generally be formed of $Si_{[y]}Ge_{[1-y]}$ and the capping layer may be formed of $Si_{[x]}Ge_{[1-x]}$ where $0 \leq x \leq 1$, $0 \leq y \leq 1$ and x and y are different. The difference in x and y ratios can allow the capping layer to introduce strain in the fin. In some implementations, the capping layer composition may be similar to the substrate composition. For instance, in some implementations, for a p-type device, such as a pFET, the substrate may be a silicon substrate and the capping layer may be of silicon, e.g., consisting of silicon. For an n-type device, such as nFET, the substrate and the capping layer may be of silicon-germanium, for instance $Si_{0.5}Ge_{0.5}$.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Various methods for cutting a fin into a number of fin parts will now be disclosed in connection with FIGS. 1-18.

Figure 1:
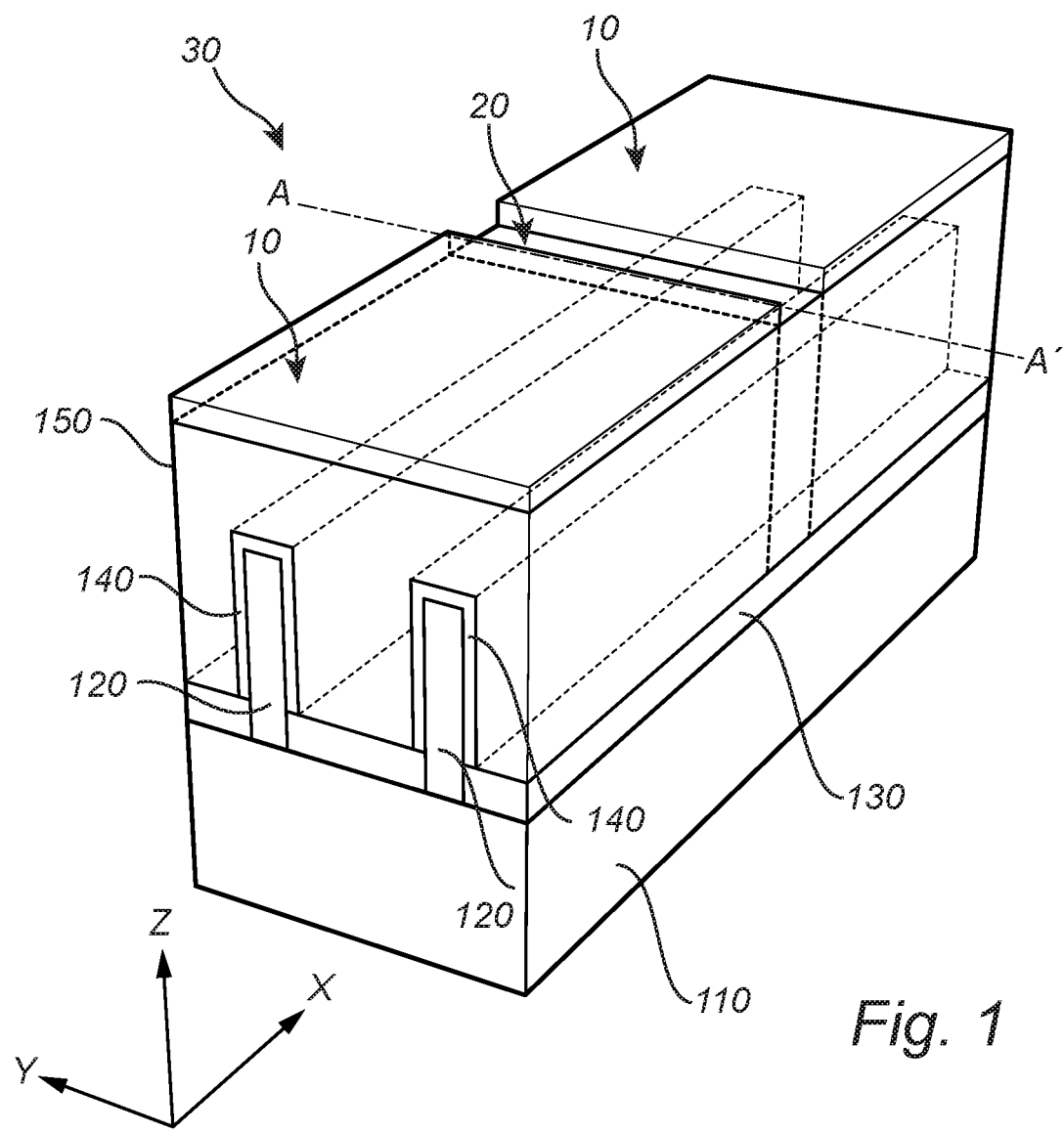
FIGS. 1, 2, 3, 4, 5, 6, 7, 8, 9, 10, 11, 12, 13, 14, 15, 16, 17, and 18 schematically illustrate various methods of cutting a fin structure into a number of fin parts.

FIG. 1 shows in perspective a sectional view of a region of a substrate 110. In FIG. 1, the axis Z denotes a vertical direction, corresponding to a normal direction with respect to an upper surface of the substrate 110. The axis X denotes a first horizontal direction along the substrate 110 and the axis Y denotes a second horizontal direction along the substrate 110, perpendicular to the first direction X. It should be noted that in the drawings the relative dimensions of the shown elements, such as the height, width or thickness of elements, is merely schematic and may, for the purpose of illustrational clarity, differ from a physical structure.

A number of semiconductor fins 120 can extend along the substrate 110. FIG. 1 shows two fins 120 for clarity of illustration. However, it will be appreciated there may be any number of further fins outside the illustrated region. Each fin 120 extends in parallel to the X axis. In FIG. 1, each fin 120 protrudes vertically above the substrate 110, e.g., in parallel to the Z axis. By way of example, a typical height of a fin 120 above the substrate 110 may be in a range from 20 to 200 nm. A width of a fin 120 (e.g., along the Y axis) may be in a range from 3 to 30 nm for example.

The substrate 110 may be any conventional substrate 110, such as a substrate suitable for complementary metal-oxide semiconductor (CMOS) processing. The substrate 110 may be a semiconductor substrate such as a Si substrate, a Ge substrate or a silicon-germanium (SiGe) substrate. Other examples include a silicon-on-insulator (SOI) substrate, a GeOI substrate or a SiGeOI substrate.

The fins 120 may be formed of a silicon and/or germanium comprising material, e.g., of silicon-germanium ($Si_{[y]}Ge_{[1-y]}$ and $0 \leq y \leq 1$), depending on the intended application. The fins 120 may also be multi-layered fins, e.g., formed of a stack of two or more silicon and/or germanium comprising material layers of different compositions. A multi-layered fin may for instance comprise a first layer of $Si_{[y1]}Ge_{[1-y1]}$ with $0 \leq y1 \leq 1$ and a second layer of $Si_{[y2]}Ge_{[1-y2]}$ with $0 \leq y2 \leq 1$ and $y2 \neq y1$. The second layer may be formed on the first layer. The first layer may form a "sacrificial" layer intended to be removed at a later stage of device processing, selectively to the second layer. The second layer may form a "channel" layer intended to allow formation of a transistor channel. The sacrificial layer may be removed selectively with respect to the channel layer, wherein the second layer may remain to allow formation of a gate structure completely wrapping around the "suspended" second layer. As per se is known in the art, fins may comprise a repetitive sequence of such first and second layers to allow formation of vertically stacked channel layers.

The fins 120 (or at least a bottom-layer thereof in case of multi-layered fins) may be formed of a material having a lattice constant different than the substrate 110. Thereby, the fins 120 may be pre-strained due to a lattice mismatch at an interface between the fins 120 and the upper surface of the substrate 110. For instance, the upper surface of the substrate 110 may be formed by Si and the fins 120 may be formed of $Si_{[y]}Ge_{[1-y]}$ and $0 \leq y \leq 1$, or vice versa. As will be further described below, a capping layer 140 may be formed on the fins 120 to reduce and/or counteract relaxation of pre-strained fins after a fin cut process. It is however also possible to form the fins 120 without any pre-strain, e.g., by forming the fins 120 of a material not presenting a lattice-mismatch with respect to the upper surface of the substrate 110.

The fins 120 may be formed in a manner which per se is known in the art, e.g., by patterning the fins 120 in one or more epitaxial semiconductor layers by etching trenches in the semiconductor layer(s). The epitaxial semiconductor layer(s) may be formed in an epitaxial growth process on the upper surface of the substrate 110 using e.g., chemical vapor deposition (CVD), metalorganic CVD (MOCVD), molecular beam epitaxy (MBE) or vapor phase epitaxy (VPE) techniques. If the substrate 110 comprises a semiconductor-on-insulator structure, the fins 120 may be patterned directly in the semiconductor layer of the structure in some instances.

Subsequent to forming the fins 120, a bottom portion of the semiconductor fin 120 may be embedded in an insulating layer 130. The insulating layer 130 may cover the substrate 110 in regions adjacent to and in between the fins 120. An insulating material, e.g., an oxide material such as silicon dioxide or a low-k dielectric material, may be deposited and etched back to define a layer of a desired thickness. The insulating layer 130 may for instance form a shallow-trench-insulation (STI), filling lower portions of trenches formed between fins during fin patterning.

The method can include forming an epitaxial capping layer 140 on the fins 120. The capping layer 140 can cover a top surface and sidewall surfaces of each fin 120. The capping layer 140 may form a cladding on each fin 120. For example, the capping layer 140 may be formed on surface portions of each fin 120 exposed above the insulating layer 130. The capping layer material and a fin material can be lattice mismatched with respect to each other such that an interface between each fin 120 and the capping layer 140 forms a lattice-mismatched heterojunction. For instance, in case of a Si- and/or Ge-comprising fins 120 ($Si_{[y]}Ge_{[1-y]}$) the capping layer 140 may be formed of a different Si- and/or Ge-comprising material (e.g. $Si_{[x]}Ge_{[1-x]}$ where $0 \leq x \leq 1$ and $x \neq y$). In case of multi-layered fins 120, the composition of the capping layer 140 may advantageously be different from the composition of the sacrificial layer(s) in some instances.

By way of example, on fins 120 of $Si_{[y]}Ge_{[1-y]}$ intended to support p-type device fabrication (e.g., p-type FETs), the capping layer 140 may be formed of a material having a lower Ge-content than the fins. Conversely, on fins 120 intended to support n-type device fabrication (e.g., n-type FETs) the capping layer 140 may be formed of a material having a greater Ge-content than the fins. In case of multi-layered fins 120 comprising two or more silicon and/or germanium comprising material layers of different compositions, the capping layer material may be different from at least one of the layers, e.g., at least each of the one or more second "channel" layers.

The lattice mismatch between the capping layer 140 and each fin 120 may induce strain in the fin 120. The strain may be compressive or tensile, depending on the degree of lattice mismatch. Parameters for the capping layer 140 relevant for the strain-inducing function can comprise the degree of lattice mismatch with respect to the fins 120 and a thickness of the capping layer 140. The capping layer 140 may be formed with a composition and a thickness such that a desired amount of strain is induced in each fin 120. In a case the fins 120 are pre-strained due to lattice mismatch between the fins 120 and the substrate 110, the capping layer 140 may create additional strain in each fin 120.

The capping layer 140 may be formed in an epitaxial growth process. Due to the presence of the insulating layer 130, capping layer growth on the upper surface of the substrate 110 may be reduced and/or counteracted wherein the capping layer 140 may be selectively deposited on the surface portions of each fin 120 protruding above the insulating layer 130.

According to one example, for the case of non-pre-strained fins 120 for a pFET device, the substrate 110 may be formed of $Si_{0.7}Ge_{0.3}$, the fins 120 may be 7 nm wide and be formed of $Si_{0.7}Ge_{0.3}$, and the capping layer 140 may be 3 nm thick and be formed of Si material. According to another example, for the case of non-pre-strained fins 120 for an nFET device, the substrate 110 may be formed of Si, the fins 120 may be 7 nm wide and be formed of Si, and the capping layer 140 may be 3 nm thick and be formed of $Si_{0.7}Ge_{0.3}$ material. According to another example, for the case of pre-strained fins 120 for a pFET device, the substrate 110 may be formed of Si, the fins 120 may be 7 nm wide and be formed of $Si_{0.7}Ge_{0.3}$, and the capping layer 140 may be 3 nm thick and be formed of Si material. According to another example, for the case of pre-strained fins 120 for an nFET device, the substrate 110 may be formed of $Si_{0.7}Ge_{0.3}$, the fins 120 may be 7 nm wide and be formed of Si, and the capping layer 140 may be 3 nm thick and be formed of $Si_{0.7}Ge_{0.3}$ materials. It should be noted that these examples only are provided as illustrative examples and that other compositions and dimensions of the various elements also are possible.

Subsequent to forming the capping layer 140, the fins 120 with the capping layer 140 formed thereon may be embedded and covered in a further insulating layer 150. The insulating layer 150 may be formed using any of the techniques and any of the materials discussed in connection with the insulating layer 130. The method can include forming a fin cut mask 30 above the fins 120. The fin cut mask 30 can define a number of mask regions 10 (in which respective fin parts can remain following fin cutting) and a number of cut regions 20 (in which the fins 120 can be cut by etching). As the fin parts remaining in the mask regions 10 may be used to define active devices, the mask regions may in the following be referred to as active regions 10. The region illustrated in FIG. 1 shows a single cut region 20, however as would be appreciated by the skilled person a plurality of such cut regions may be defined along the length of each fin 120. A length of the cut region 20, defining a separation between two adjacent fin parts 122 may be in a range from 5 to 200 nm, depending on the intended application.

The fin cut mask 30 may be a photoresist layer with lithographically defined active regions 10 and cut regions 20. The fin cut mask 30 may also be a lithographic mask layer stack (a "litho stack"), comprising in a bottom-up-direction for instance a patterning layer (e.g., an organic or non-organic patterning film), one or more transfer layers (e.g., anti-reflective coatings such as SiOC layers or spin-on-glass layers, and a planarization layer such as a spin-on-carbon layer), and a photoresist layer. As per se is known in the art, a pattern may be lithographically defined in the photoresist layer and subsequently transferred into lower layers of the litho stack, in a number of etch steps, and subsequently into the patterning layer. The pattern may thereafter be transferred from the patterning layer into the underlying layers, e.g., the insulating layer 150 and the fins 120, as will be described below.

Figure 2:
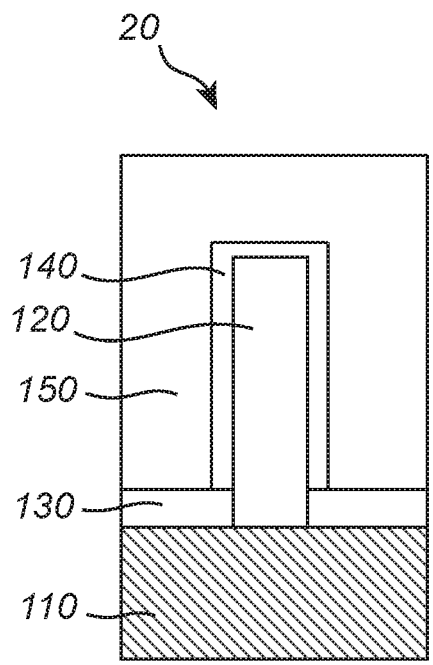

FIG. 2 is a plan view of a cross-section of FIG. 1 of one fin 120 along the geometrical line AA' shown in the cut region 20 at a stage subsequent to formation of the fin cut mask 30. Although, reference in the following may be made to one fin 120, the following process steps may be performed in parallel on any further fins.

Figure 3:
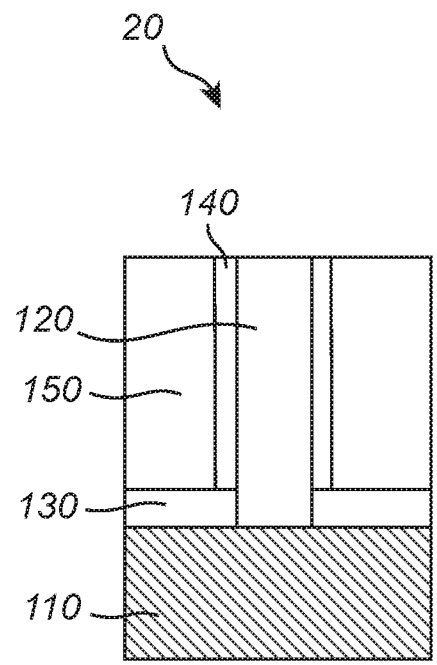

In FIG. 3, the insulating layer 150 has been etched back in the fin cut region 20 to expose a portion of the capping layer 140 covering the upper surface of the fin 120. The insulating layer 150 may be etched back using any conventional oxide or dielectric wet or dry etch process allowing etching of the insulating layer 150. The exposed portion of the capping layer 140 has thereafter been opened to expose the upper surface of the fin 120. The exposed portion of the capping layer 140 may be removed in a wet or vapor etching process. For instance, a HCl-based etching process such as a HCl vapor etch may be used. The capping layer 140 may be opened by etching the capping layer material selectively to the fin material forming the upper surface of the fin 120.

Figure 4:
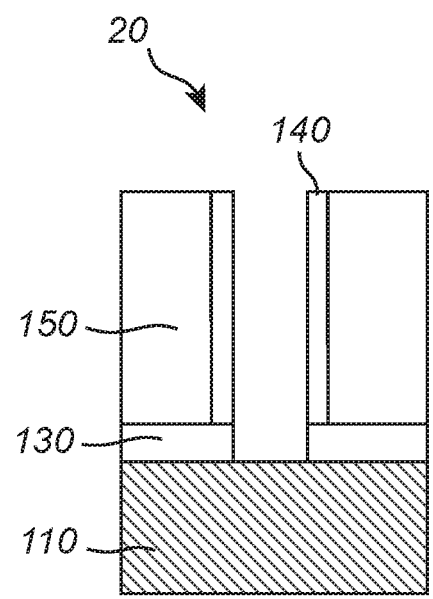
Figure 5:
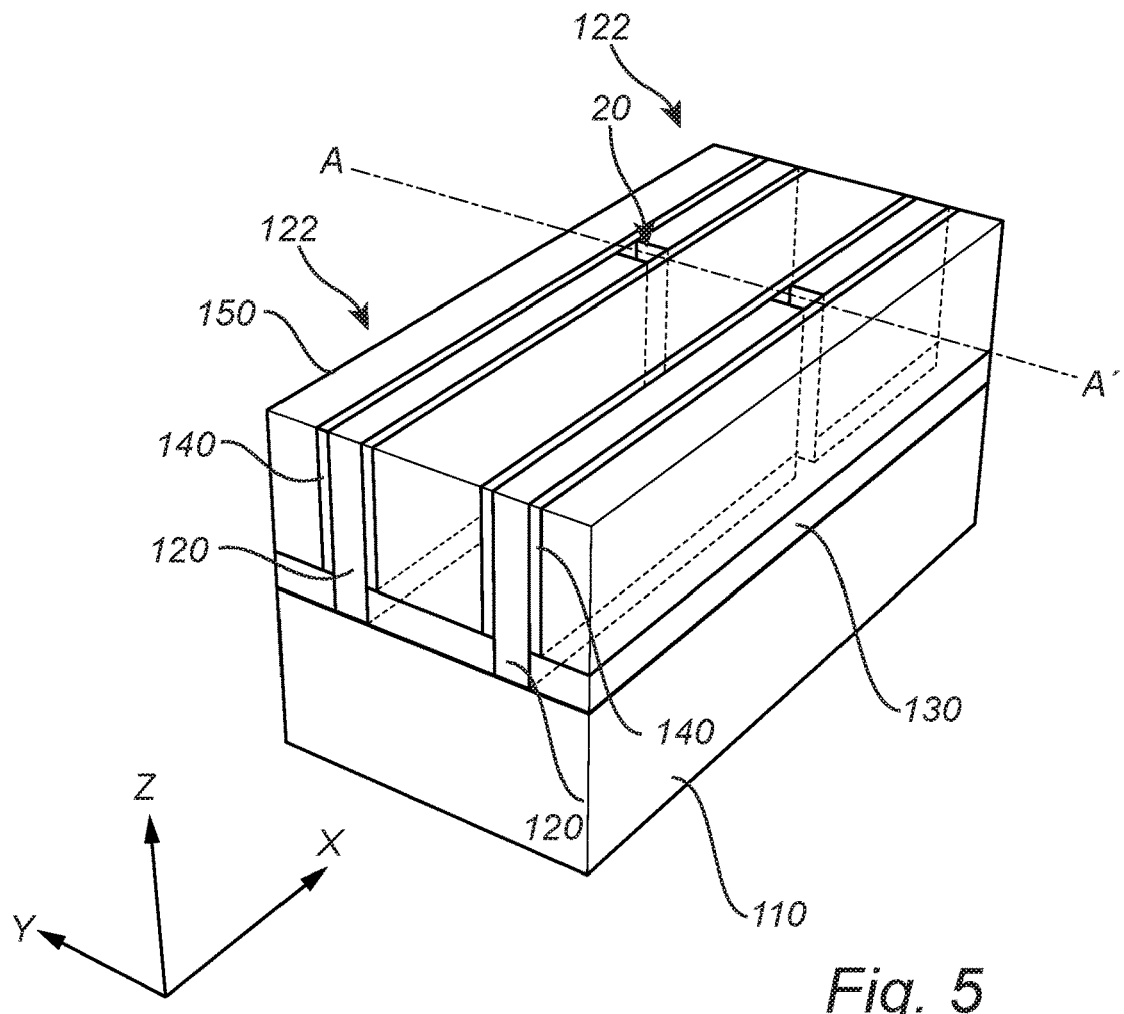

In FIG. 4, the fin 120 has been cut by etching the fin 120 in the cut region 20. The fin 120 has been cut or divided into a number of fin parts 122 remaining in the active regions 10. A perspective view subsequent to the fin cut and removal of the fin cut mask 30 is shown in FIG. 5. As shown, the fin parts 122 are separated by gaps formed in the cut regions 20. In the illustrated case, a selective etching approach has been used such that the capping layer 140 covering sidewalls of the semiconductor fin 120 is preserved. It should however be noted that the removal of the capping layers 140 and the fins 120 may also be performed in a single etching step e.g., simultaneous etching of the fin 120 and the capping layer 140, e.g., provided the materials of the capping layer 140 and the fin 120 are not too dissimilar. The fin 120 may be etched using wet or vapor etching, for instance HCl-vapor etch. In some implementations, as described above, the presence of the capping layer 140 on the fin parts 122 may provide that the fin parts 122 form strained fin parts 122. In the illustrated case, the fin cut depth corresponds to the height of the fin 120, e.g., the cut extends completely through the fin 120. However, it is also possible to cut the fin by etching partially through the height of the fin 120. For improved fin-to-fin isolation, in some instances, it may be advantageous to extend the etching even into the underlying substrate, e.g., forming cuts being deeper than the original fin height.

According to a variation, provided the material of the insulating layer 150 has the ability to withstand the etching processes during the fin cutting, it is possible to remove the fin cut mask 130 subsequent to opening the insulating layer 150 in the cut regions 20. The capped fin 120 may thereafter be cut by etching in the cut regions 20, via the openings in the insulating layer 150, while the insulating layer 150 masks the capped fin 120 in the active regions 10. The fin cut mask 30 may be used to define the active regions 10 and the cut regions 20 but need not be used as an etch mask during the fin cutting.

It should be noted that it is also possible to etch back the insulating layer 150 to make the upper surface thereof flush with the upper surface of the capped fin, prior to forming the fin cut mask 30. For example, the fin cut mask 30 may be defined to cover the capped fin in the active regions 10 and expose the capped fin in the cut regions 20, and thereafter be used as an etch mask during the fin cutting.

Figures 6, 7:
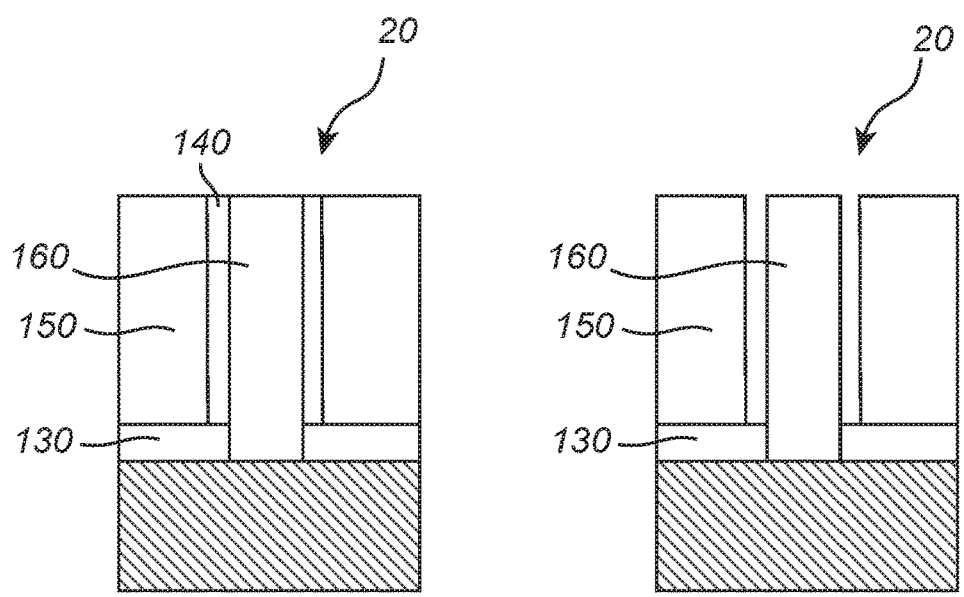

FIG. 6 shows a plan view of a cross-section of the fin 120 along line A-A' wherein the gap in the cut region 20 has been refilled with a fill structure 160 of an insulating material. The fill structure 160 may be formed of a dielectric material such as $SiO_2$, $Si_3N_4$, $HfO_2$, $ZrO_2$. These dielectric materials may be deposited using a CVD, physical vapor deposition (PVD), or atomic layer deposition (ALD) technique. The fill structure may subsequently be subjected to an anneal step such that the insulating material of the fill structure 160 may solidify. An anneal step may however be omitted if the fill structure 160 is in a solid state already after being deposited. The fill structure 160 may be deposited such that a height of the fill structure 160 may be the same as the height of the fin 120, or slightly below. Although in the illustrated process flow, the fin cut mask 30 has been removed prior to forming the fill structure 160, it is also possible to first form the fill structure 160 (and optionally perform the anneal) and thereafter remove the fin cut mask 30.

With reference to FIG. 7, subsequent to forming the fill structure 160, portions of the capping layer 140 extending through the cut region 10 have been removed by etching. The capping layer 140 may also be cut into a number of capping layer parts, each capping layer part formed on a respective fin part 122. The removal of the capping layer 140 may provide electrical insulation of the fin parts 122, e.g., for the purpose of subsequent device processing.

Figure 8:
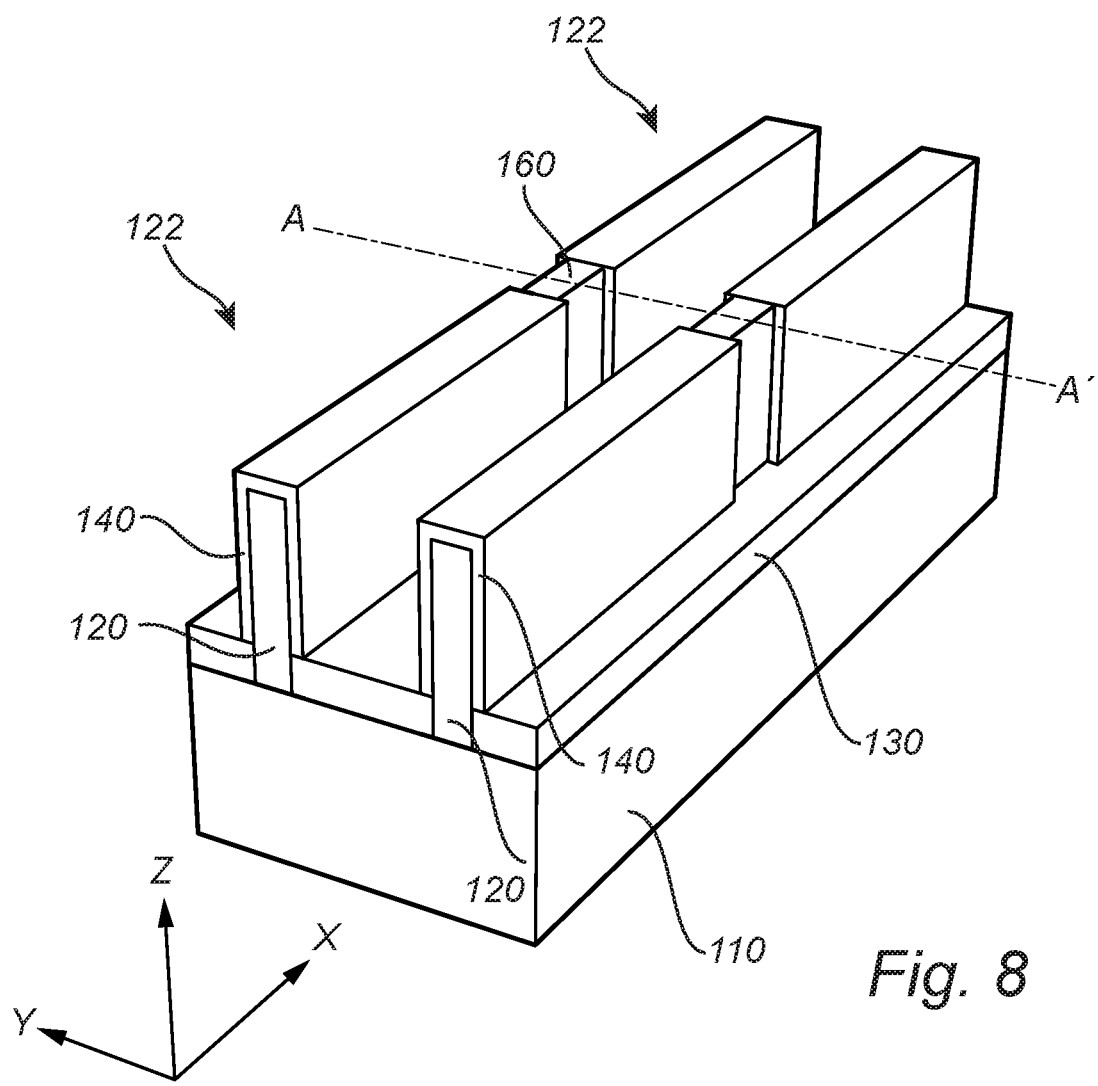

FIG. 8 shows a perspective view of the structure of FIG. 7 after removal of the insulating material 150. As shown in FIG. 8, the gaps in the cut region 20 can be filled with the fill structure 160.

Figure 9:
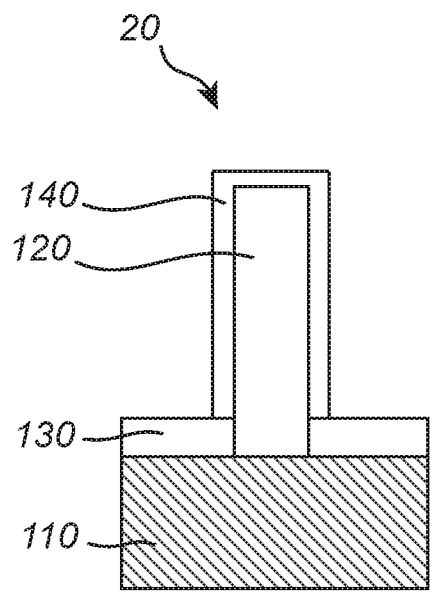

FIGS. 9-14 show another method for cutting a semiconductor fin. FIG. 9 shows a plan view of a cross-section of a fin 120 and a capping layer 140 within a cut region 20, however at a stage prior to forming the insulating layer 150 and the fin cut mask 30.

Figure 10:
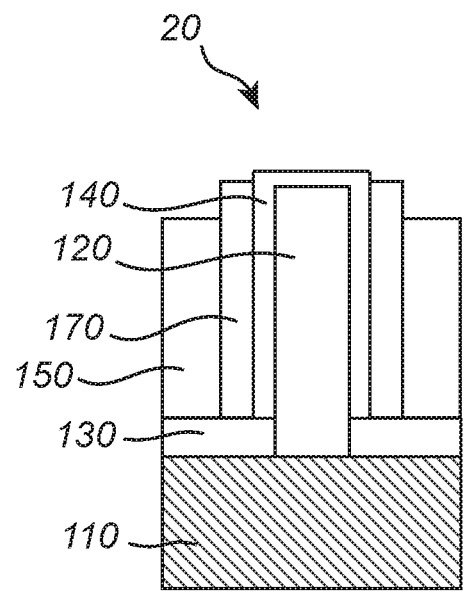

In FIG. 10, a sidewall spacer 170 has been formed on and along sidewalls of the capped fin 120. The sidewall spacer 170 may be formed of an insulating material, for instance a nitride-based material such as $Si_3N_4$, an oxide-based material such as $SiO_2$, or an hafnium-based material such as $HfO_2$. The sidewall spacer 170 may be formed in a sidewall spacer deposition approach. A spacer layer may be conformally deposited, e.g., by ALD, to cover the capped fin(s) 120 and the insulating layer 130. Spacer layer portions deposited on horizontally oriented surfaces may subsequently be removed using a vertical anisotropic etch step, such that spacer layer portions deposited on vertically oriented surfaces may be preserved to form the sidewall spacer 170. Subsequent to forming the sidewall spacer 170, the insulating layer 150 may be formed to embed the fin(s) 120 with the capping layer 140 and the sidewall spacer 170 formed thereon.

Figure 11:
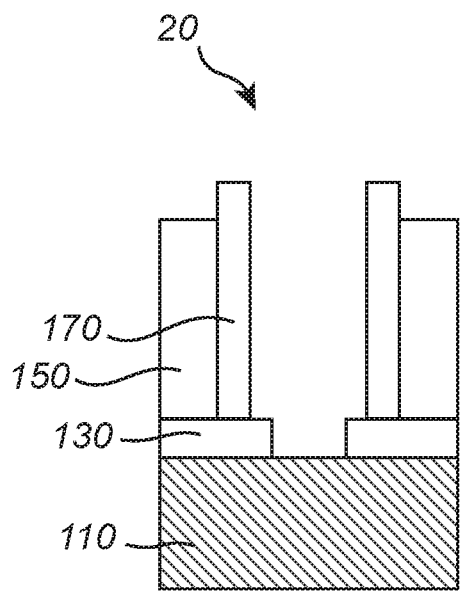

With reference to FIG. 11, the method may include fin cut mask formation and fin cutting as outlined above. As further discussed above, also the capping layer 140 may be removed in the cut region 20.

Figure 12:
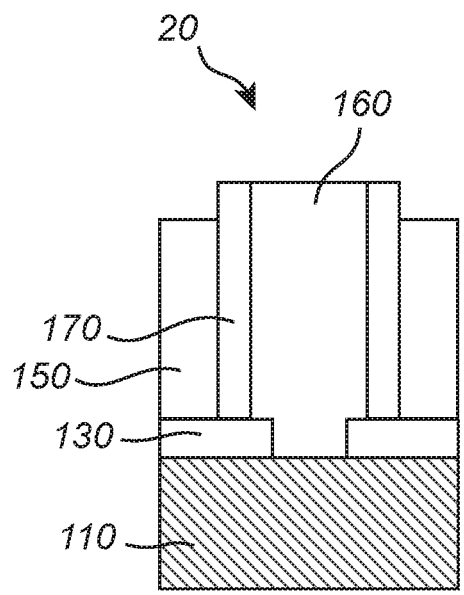
Figure 13:
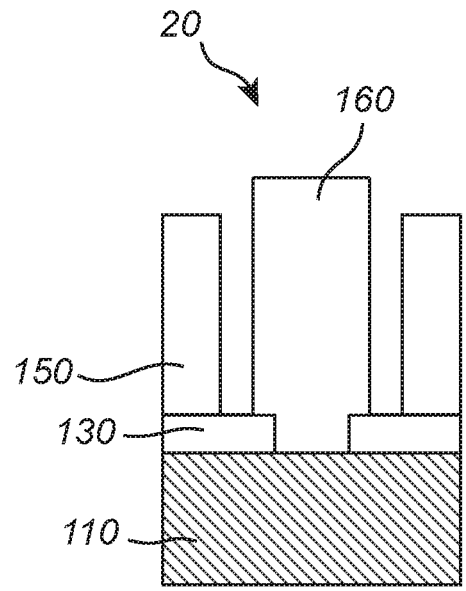
Figure 14:
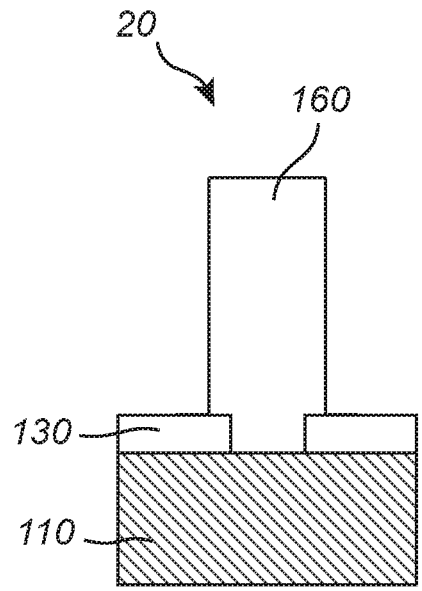

A fill structure 160 may thereafter be formed in the cut region 20, between fin parts, as shown in FIG. 12. In FIG. 13, the sidewall spacer 170 has been removed. The sidewall spacer 170 may be removed from an entire (or substantially entire) length of the fin 120. FIG. 14 shows the resulting structure following removal of the insulating layer 150.

Figure 15:
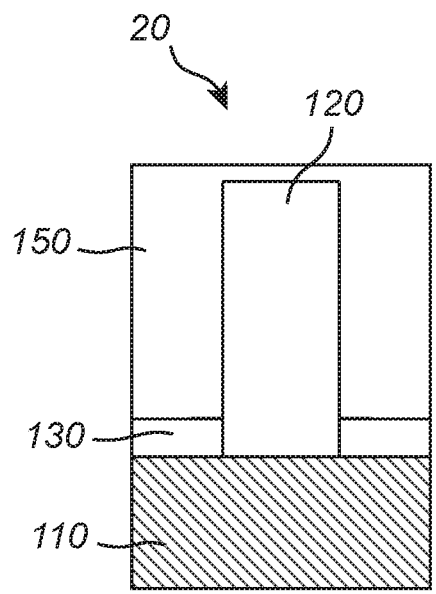
Figure 16:
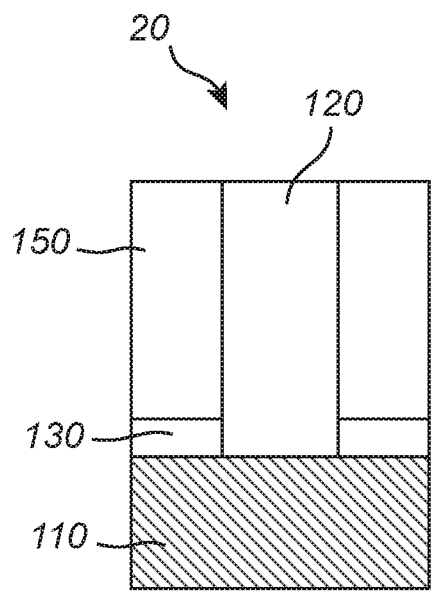
Figure 17:
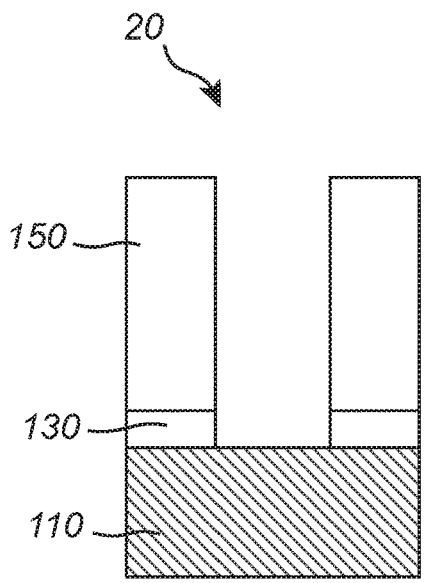

FIGS. 15-18 show yet another method of cutting a semiconductor fin 120. FIGS. 15-17 illustrate cutting of a fin into a number of fin parts (fin parts 222, see FIG. 18) by etching the fin in a cut region 20 without any preceding capping layer formation step.

Figure 18:
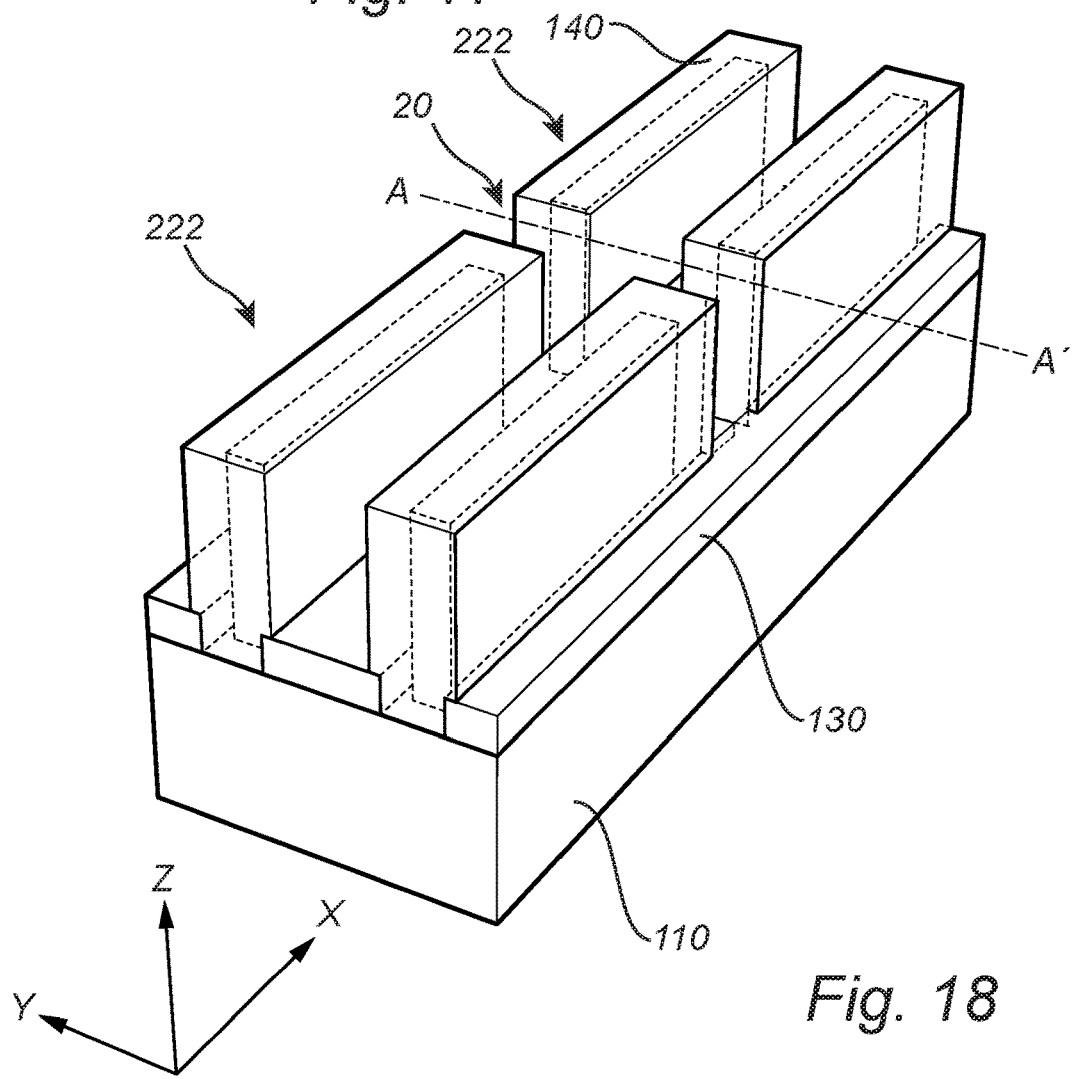

FIG. 18 shows a perspective view subsequent to the fin cut process and after removal of the insulating material 150. A capping layer 140 has been formed on each fin part 222. The discussion of the capping layer 140 in connection with the above methods can apply correspondingly to this method. In contrast to the above, the capping layer 140 shown in FIG. 18 can be formed also on the end surfaces of the fin parts 222, which are exposed in/face the cut regions during the capping layer 140 formation. The capping layer 140 may introduce strain into the fin parts 222.

In the above, the inventive concepts have mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of forming a semiconductor structure, the method comprising:
   providing a semiconductor fin extending along a substrate;
   forming a fin cut mask, the fin cut mask defining a number of masked regions and a number of cut regions;
   cutting the fin into a number of fin parts by etching the fin in the cut regions;
   forming an epitaxial semiconductor capping layer continuously covering at least a top surface and opposing sidewall surfaces of the fin prior to forming the fin cut mask, wherein the opposing sidewall surfaces of the fin extend vertically above the substrate with the corresponding top surface of the fin extending horizontally therebetween, wherein a capping layer material of the epitaxial semiconductor capping layer and a fin material of the semiconductor fin are lattice mismatched;
   forming a fill structure by refilling gaps in the cut regions between fin parts with an insulating material; and
   subsequent to forming the fill structure, removing the epitaxial semiconductor capping layer in the cut regions between fin parts while preserving the epitaxial semiconductor capping layer covering the opposing sidewall surfaces of the fin.

2. The method according to claim 1, further comprising subjecting the fill structure to an anneal.

3. The method according to claim 1, further comprising, prior to forming the fin cut mask, forming an insulating layer embedding a bottom portion of the fin, wherein forming the capping layer comprises forming the capping layer on an upper portion of the fin protruding above the insulating layer.

4. The method according to claim 1, further comprising, subsequent to forming the capping layer and prior to forming the fin cut mask, forming a sidewall spacer layer on capping layer portions formed along sidewalls of the fin.

5. The method according to claim 4, further comprising, subsequent to forming the sidewall spacer layer, forming an insulating layer embedding the fin with the capping layer and the sidewall spacer layer formed thereon.

6. The method according to claim 4, further comprising, removing the sidewall spacer layer subsequent to cutting the fin.

7. The method according to claim 1, wherein the capping layer is an epitaxial layer comprising one or both of silicon and germanium.

8. The method according to claim 1, wherein the semiconductor fin is formed of a material comprising one or both of silicon and germanium.

9. The method according to claim 1, wherein the substrate is a semiconductor substrate providing a pre-strain to the fin.

10. A method of forming a semiconductor structure, the method comprising:
    providing a semiconductor fin extending along a substrate;
    forming a fin cut mask, the fin cut mask defining a number of masked regions and a number of cut regions;
    cutting the fin into a number of fin parts by etching the fin in the cut regions;
    forming an epitaxial semiconductor capping layer on the fin prior to forming the fin cut mask, wherein a capping layer material of the epitaxial semiconductor capping layer and a fin material of the semiconductor fin are lattice mismatched;
    forming a fill structure by refilling gaps in the cut regions between fin parts with an insulating material; and
    removing the epitaxial semiconductor capping layer in the cut regions subsequent to forming the fill structure.

11. The method according to claim 10, further comprising subjecting the fill structure to an anneal.

12. The method according to claim 10, further comprising, prior to forming the fin cut mask, forming an insulating layer embedding a bottom portion of the fin, wherein forming the capping layer comprises forming the capping layer on an upper portion of the fin protruding above the insulating layer.

13. The method according to claim 10, wherein the capping layer is an epitaxial layer comprising one or both of silicon and germanium.

14. The method according to claim 10, wherein the semiconductor fin is formed of a material comprising one or both of silicon and germanium.

15. The method according to claim 10, wherein the substrate is a semiconductor substrate providing a pre-strain to the fin.

* * * * *